United States Patent
Boon et al.

(10) Patent No.: US 9,588,336 B1
(45) Date of Patent: Mar. 7, 2017

(54) LIQUID DUCT FOR AN ELECTROWETTING DISPLAY

(71) Applicant: Amazon Technologies, Inc., Seattle, WA (US)

(72) Inventors: Gerben Boon, Ottersum (NL); Christian Etienne Hendriks, Eindhoven (NL); Daniel Figura, Piestany (SK)

(73) Assignee: Amazon Technologies, Inc., Seattle, WA (US)

( * ) Notice: Subject to any disclaimer, the term of this patent is extended or adjusted under 35 U.S.C. 154(b) by 119 days.

(21) Appl. No.: 14/574,216

(22) Filed: Dec. 17, 2014

(51) Int. Cl.
*G02B 26/00* (2006.01)
*G02B 26/02* (2006.01)
*G02B 1/10* (2015.01)
*G02B 1/12* (2006.01)
*G09G 3/34* (2006.01)

(52) U.S. Cl.
CPC ............ *G02B 26/005* (2013.01); *G02B 1/10* (2013.01); *G02B 1/12* (2013.01); *G02B 26/004* (2013.01); *G02B 26/02* (2013.01); *G09G 3/348* (2013.01); *G09G 3/34* (2013.01); *G09G 2300/04* (2013.01)

(58) Field of Classification Search
CPC .. G02B 26/004; G02B 26/005; G02B 26/007; G02B 26/02; G09G 3/348; G09G 3/3433; G09G 2300/04; G09G 2300/0439; B01L 2400/0427; B01L 3/502; B01L 3/5027; B01L 3/502715; B60R 1/025; B60R 1/06; B60R 1/088

USPC ................ 359/228, 245, 253, 290–292, 295; 345/60, 64, 84, 205, 690; 204/518, 627
See application file for complete search history.

(56) References Cited

U.S. PATENT DOCUMENTS

| | | | | | |
|---|---|---|---|---|---|
| 7,813,030 | B2 * | 10/2010 | Lo | ......................... | G02B 26/005 345/60 |
| 8,059,328 | B1 * | 11/2011 | Kuo | ..................... | G02B 26/005 359/290 |
| 8,810,882 | B2 * | 8/2014 | Heikenfeld | .......... | G02B 26/004 345/107 |
| 8,854,718 | B2 * | 10/2014 | Jung | .................... | G02B 26/005 359/228 |
| 9,070,322 | B2 * | 6/2015 | Huitema | ............. | G02B 26/005 |
| 9,134,585 | B2 * | 9/2015 | Tonar | ...................... | B60R 1/088 |
| 9,180,454 | B2 * | 11/2015 | Heikenfeld | .......... | G02B 26/004 |
| 9,182,589 | B2 * | 11/2015 | Sakai | ................... | G02B 26/005 |
| 9,201,235 | B2 * | 12/2015 | Jung | .................... | G02B 26/005 |
| 9,348,132 | B1 * | 5/2016 | Novoselov | ........... | G02B 26/005 |
| 9,442,284 | B2 * | 9/2016 | Kim | ....................... | G02B 26/005 |
| 9,465,207 | B1 * | 10/2016 | Novoselov | ........... | G02B 26/005 |
| 2014/0029080 | A1 * | 1/2014 | Hwang | ................ | G02B 26/005 359/290 |

* cited by examiner

*Primary Examiner* — Loha Ben
(74) *Attorney, Agent, or Firm* — Lee & Hayes, PLLC

(57) ABSTRACT

A method for fabricating an electrowetting display may include depositing a sacrificial layer on a support plate, etching portions of the sacrificial layer to form liquid duct forms on the support plate, depositing a photoresist layer on the liquid duct forms and the support plate, etching portions of the photoresist layer to form a spacer grid, and removing the liquid duct forms to form liquid ducts between the support plate and the portions of the spacer grid.

19 Claims, 12 Drawing Sheets

LIQUID DUCT FOR AN ELECTROWETTING DISPLAY

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, finding ways to enhance user experience and satisfaction continues to be a priority. Moreover, increased multimedia use imposes high demands on designs, packaging, and fabricating display devices, as content available for mobile use becomes more extensive and device portability continues to be a high priority.

An electrowetting display includes an array of pixels individually bordered by pixel walls that retain liquid, such as opaque oil, for example. Light transmission through each pixel is adjustable by electronically controlling a position of the liquid in the pixel. Resolution and quality of an electrowetting display may depend on a number of factors, such as optical transmissivity or reflectivity of material layers of the electrowetting display and pixel size, just to name a few examples.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
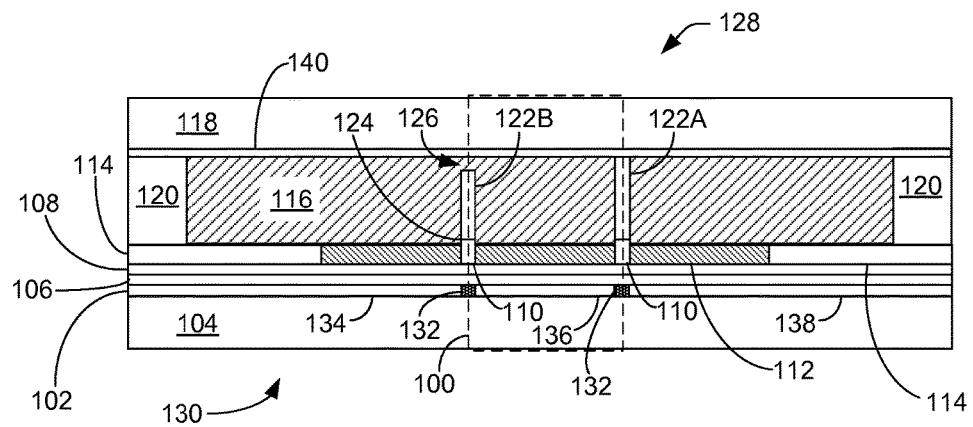
FIG. 1 illustrates a cross-section of a portion of an electrowetting display, according to some embodiments.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like. Various embodiments described herein include structures that may be included in electrowetting displays and techniques for fabricating such structures.

In some embodiments, an electrowetting display includes a first support plate and an overlying second support plate and a plurality of pixel regions therebetween. Each of the pixel regions may include one or more hydrophobic surfaces, an oil, and an electrolyte solution at least partially surrounding the oil. Portions of pixel regions may be partitioned or delineated from one another by pixel walls disposed on the first support plate. A spacer grid that mechanically connects the first support plate with the second support plate, or which forms a separation between the first support plate and the second support plate, contributes to mechanical integrity of the electrowetting display. Herein, unless otherwise indicated, a viewing side of an electrowetting display is not limited to the side of the display that includes either the first support plate or the second support plate.

A spacer grid incorporated in an electrowetting display contributes to the mechanical integrity of the electrowetting display. In particular, a spacer grid allows for a relatively large amount of surface area of a second support plate to be mechanically supported by the spacer grid. This is in contrast to a relatively small amount of surface area of the second support plate mechanically supported by individual spacers that are columns or pillars. These spacers are generally disposed at various locations (e.g., at pixel wall intersections) across an array of pixel regions of an electrowetting display. Though a spacer grid may provide more strength than columnar-type spacers, a spacer grid may tend to block flow of electrolyte solution among the pixel regions. Such flow, for example, may be important during a fabrication process when a bottom portion of an electrowetting display is joined to a top portion of the electrowetting display and excess electrolyte solution therebetween is squeezed out from the assembly. Accordingly, embodiments herein describe a spacer grid that includes liquid ducts, which allow electrolyte solution to flow through the liquid ducts in the spacer grid among pixel regions. For example, a liquid duct may comprise an opening or channel in a portion of the spacer grid between adjacent pixel regions. Such an opening may be bordered by the second support plate, for example.

During a fabrication process, the first support plate may be laminated or otherwise coupled to a second support plate by a rolling process, for example. During such a process, excess electrolyte solution may be squeezed out from between the first support plate and the second support plate. Excess electrolyte solution may flow through liquid ducts situated at or near top portions of the spacer grid, relatively far above the oil. Because of this distance between the liquid ducts, through which excess electrolyte solution flows, and the oil, a tendency of flowing excess electrolyte solution to disturb (e.g., drag) the oil will be reduced.

In some embodiments, a spacer grid may be joined to tops of pixel walls disposed on a first support plate. Herein, "joined" elements need not be glue or adhered to one another, but may merely be placed in contact with one another or may be adjacent to one another with a relatively small gap therebetween, for example. After assembly of an electrowetting display that includes first and second support plates, the spacer grid may add to the height of the pixel walls disposed on the first support plate. The resulting extra wall height provides a number of benefits. For example, extra wall height may help prevent oil from "spilling" over pixel walls from one pixel region to an adjacent pixel region. Such spilling may potentially occur as a result of physical shock (e.g., external impact) imposed on the electrowetting display device, for example. Such spilling may also occur if a pixel is operated with a driving voltage that is relatively large, with or without the combination of a physical shock imparted on the electrowetting display device. In this case, oil may be displaced "tightly" against pixel walls toward an edge of the pixel. Because forces inducing such displacement are primarily in a horizontal (e.g. parallel with the support plates) direction, the displaced oil tends to be squeezed in an upward direction along the pixel walls resulting in a relatively tall bead of oil. Such a tall bead of oil may spill over the pixel walls. Adding a spacer grid to increase the overall height of the pixel walls may prevent such spillover, thus allowing pixels to be operated at relatively large driving voltages, which can improve brightness and contrast ratio of an electrowetting display.

In a number of embodiments, a display device, such as an electrowetting display device, may be a transmissive, reflective or transflective display that generally includes an array of pixels (e.g., or subpixels) configured to be operated by an active matrix addressing scheme. For example, rows and columns of electrowetting pixels are operated by controlling voltage levels on a plurality of source lines and gate lines. In this fashion, the display device may produce an image by selecting particular pixels to at least partly transmit, reflect or block light. Pixels are addressed (e.g., selected) via rows and columns of the source lines and gate lines that are electrically connected to transistors (e.g., used as switches) included in each pixel. Transistors take up a relatively small fraction of the area of each pixel. For example, the transistor may be located underneath the reflector in reflective displays. Herein, a pixel may, unless otherwise specified, comprise a single subpixel or a pixel that includes two or more subpixels of an electrowetting display device. Such a pixel or subpixel may be the smallest light transmissive, reflective or transflective element of a display that is individually operable to directly control an amount of light transmission through and/or reflection from the element. For example, in some implementations, a pixel may be a pixel that includes a red subpixel, a green subpixel, and a blue subpixel. In other implementations, a pixel may be a pixel that is a smallest component, e.g., the pixel does not include any subpixels.

Electrowetting displays include an array of pixels comprising pixels and/or subpixels sandwiched between two support plates, such as a substrate and a top plate. For example, the substrate may be a first support plate that, in cooperation with the top plate (the second support plate), contains pixels that include oil, electrolyte solution, and pixel walls between the support plates. Support plates may include glass, plastic (e.g., a transparent thermoplastic such as PMMA or other acrylic), metal, semiconductor material, or other material and may be made of a rigid or flexible material, for example.

Pixels include various layers of materials built upon a first support plate. One such layer may be a hydrophobic layer like a fluoropolymer (e.g., Teflon® AF1600®).

Hereinafter, example embodiments describe reflective electrowetting displays comprising an array of pixels sandwiched between a first support plate and a second support plate. The first support plate may be opaque while the second support plate may be transparent. Herein, describing an element or material as being "transparent" means that the element or material may transmit a relatively large fraction of the light incident upon it. For example, a transparent substrate or layer may transmit more than 70% or 80% of the light impinging on its surface, though claimed subject matter is not limited in this respect.

The transparent second support plate may comprise glass or any of a number of transparent materials, such as plastic, quartz, semiconductors, and so on, though claimed subject matter is not limited in this respect. Also, as used herein for sake of convenience of describing example embodiments, the second support plate is that through which viewing of pixels of a (reflective) electrowetting display occurs.

Pixel walls retain at least a first fluid which is electrically non-conductive and/or non-polar, such as opaque or colored oil, in the individual pixels. A cavity formed between the support plates is filled with the first fluid (e.g., the first fluid being retained by pixel walls) and a second fluid (e.g., considered to be an electrolyte solution) that is polar and may or may not be electrically conductive, and may be a water solution, such as a mixture of water and ethyl alcohol, or a salt solution, such as a solution of potassium chloride in water. The second fluid may be transparent, but may be colored, or light-absorbing. The second fluid is at least partially immiscible with the first fluid.

In some embodiments, individual reflective electrowetting pixels may include a reflective layer on the first support plate of the electrowetting pixel, a transparent electrode layer adjacent to the reflective layer, and a hydrophobic layer on the electrode layer. Pixel walls of each pixel, the hydrophobic layer, and the transparent second support plate at least partially enclose a liquid region that includes an electrolyte solution and a light-absorbing or opaque liquid, which is immiscible with the electrolyte solution. An "opaque" liquid, as described herein, is used to describe a liquid that appears black or colored to an observer. For example, a black opaque liquid strongly absorbs a broad spectrum of wavelengths (e.g., including those of red, green and blue) in the visible region of electromagnetic radiation. In some implementations, the opaque liquid is a nonpolar oil.

The opaque liquid is disposed in the liquid region. As described in detail below, coverage area of the opaque liquid on the bottom hydrophobic layer is electronically adjustable to affect the amount of light incident on the reflective electrowetting display that reaches the reflective material at the bottom of each pixel.

A spacer grid and edge seals which mechanically connect a first support plate with a second overlying support plate, or which form a separation between the first support plate and the second support plate, contribute to mechanical integrity of the electrowetting display. Edge seals, for example, being disposed along a periphery of an array of electrowetting display device pixels, may contribute to retaining (e.g., first and second) fluids between the first support plate and the second overlying support plate.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient light) or out-coupled from a light guide of the display device. For example, display software may include code executable by a processor to modulate optical properties of individual pixels of the electrowetting display based, at least in part, on electronic signals representative of image or video data. The code may cause the processor to modulate the optical properties of pixels by controlling electrical signals (e.g., voltages, currents, fields, and so on) on, over, or in layers of the electrowetting display.

FIG. 1 is a cross-section of a portion of a reflective electrowetting display device illustrating several electrowetting pixels 100, according to some embodiments. Though three such electrowetting pixels are illustrated, an electrowetting display device may include any number (usually a very large number, such as thousands or millions) of electrowetting pixels. An electrode layer 102 is formed on a first support plate 104 and may comprise one or more individual electrodes in each electrowetting pixel.

In various embodiments, electrode layer 102 may be connected to any number of thin film transistors (TFTs) (not illustrated) that are switched to either select or deselect electrowetting pixels 100 using active matrix addressing, for example. A TFT is a particular type of field-effect transistor that includes thin films of an active semiconductor layer as well as a dielectric layer and metallic contacts over a supporting (but non-conducting) substrate, which may be glass or any of a number of other transparent or non-transparent materials, for example.

In some implementations, a barrier layer 106 may at least partially separate electrode layer 102 from a hydrophobic layer 108 also formed on first support plate 104. In some implementations, hydrophobic layer 108 may comprise any of a number of types of fluoropolymers, such as AF1600®, produced by DuPont, based in Wilmington, Del. Hydrophobic layer 108 may also be any of a number of water-repelling materials that affect wettability of an adjacent material, for example.

Pixel walls 110 form a patterned electrowetting pixel grid on hydrophobic layer 108. Pixel walls 110 may comprise a photoresist material such as, for example, epoxy-based negative photoresist SU-8. The patterned electrowetting pixel grid comprises rows and columns that form an array of electrowetting pixels. For example, an electrowetting pixel may have a width and length in a range of about 50 to 500 microns. In some implementations, the pixel walls need not be on the hydrophobic layer. For example, pixel walls may be directly on the electrode layer (not illustrated in FIG. 1).

A first fluid 112, which may have a thickness (e.g., depth) in a range of about 1 to 10 microns, for example, overlies hydrophobic layer 108. First fluid 112 is partitioned by pixel walls 110 of the patterned electrowetting pixel grid. An outer rim 114 may comprise the same material as pixel walls 110. A second fluid 116, such as an electrolyte solution, overlies first fluid 112 and pixel walls 110 of the patterned electrowetting pixel grid. First fluid 112 is at least partially immiscible with second fluid 116 so that the first fluid and the second fluid do not substantially mix with each other, and in some examples do not mix with each other to any degree. Herein, substances are immiscible with one another if the substances do not substantially form a solution. Second fluid 116 is preferably transparent, but may be colored or absorbing. First fluid 112 is non-polar and may for instance be an alkane like hexadecane or (silicone) oil.

A second support plate 118 covers second fluid 116 and edge seals 120 maintain second fluid 116 over the electrowetting pixel array. Support plate 118 may be supported by edge seals 120 and a spacer grid 122 (various portions being illustrated as 122A and 122B) that may substantially extend over the array of pixels 100. As will be explained below, some portions 122A of spacer grid 122 extend from tops 124 of pixel walls 110 to second support plate 118 while other portions 122B extend partially from tops 124 of pixel walls 110 to second support plate 118, leaving a gap 126 (e.g., channel) herein called a "liquid duct".

The reflective electrowetting display device has a viewing side 128 on which an image formed by the electrowetting display device may be viewed, and a rear side 130. Second support plate 118 faces viewing side 128 and first support plate 104 faces rear side 130. The electrowetting display device may be an active matrix driven display type or a passive matrix driven display, just to name a few examples.

Separation block 132 represents a discontinuity of electrical conductivity along electrode layer 102. For example, a first portion 134 of electrode layer 102 may be electrically insulated or separated from a second portion 136 and a third portion 138 of electrode layer 102 so that each portion 134, 136, and 138 is connected to a respective pixel region.

In some embodiments, electrowetting pixels may include a top electrode 140 disposed on second support plate 118, one or more color filters (not illustrated), or a black matric (not illustrated). The electrode on the second support plate may or may not be patterned to form any of a number of circuit configurations, for example.

Hydrophobic layer 108 is arranged on first support plate 104 to create an electrowetting surface area. The hydrophobic character causes first fluid 112 to adhere preferentially to first support plate 104 since first fluid 112 has a higher wettability with respect to the surface of hydrophobic layer 108 than second fluid 116. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 0°, in which case the fluid tends to form a film on the surface of the solid.

First fluid 112 absorbs at least a part of the optical spectrum. First fluid 112 may be transmissive for a part of the optical spectrum, forming a color filter. For this purpose, the fluid may be colored by addition of pigment particles or dye, for example. Alternatively, first fluid 112 may be colored or black (e.g., absorbing substantially all parts of the optical spectrum) or reflecting. Hydrophobic layer 108 may be transparent or reflective. A reflective layer may reflect the entire visible spectrum, making the layer appear white, or part of it, making it have a color.

If a voltage is applied across electrowetting pixel 100 (e.g., between electrode layer 102 and top electrode 140), electrowetting pixel 100 will enter into an active state. Electrostatic forces will move second fluid 116 toward electrode layer 102, thereby displacing first fluid 112 from the area of hydrophobic layer 108 to pixel walls 110 surrounding the area of hydrophobic layer 108, to a droplet-like shape. Such displacing action uncovers first fluid 112 from the surface of hydrophobic layer 108 of electrowetting pixel 100.

If the voltage across electrowetting pixel 100 is returned to an inactive signal level of zero or a value near to zero, electrowetting pixel 100 will return to an inactive state, where first fluid 112 flows back to cover hydrophobic layer 108. In this way, first fluid 112 forms an electrically controllable optical switch in each electrowetting pixel 100. Of course, such details of an electrowetting display device are merely examples, and claimed subject matter is not limited in this respect.

Figure 2:
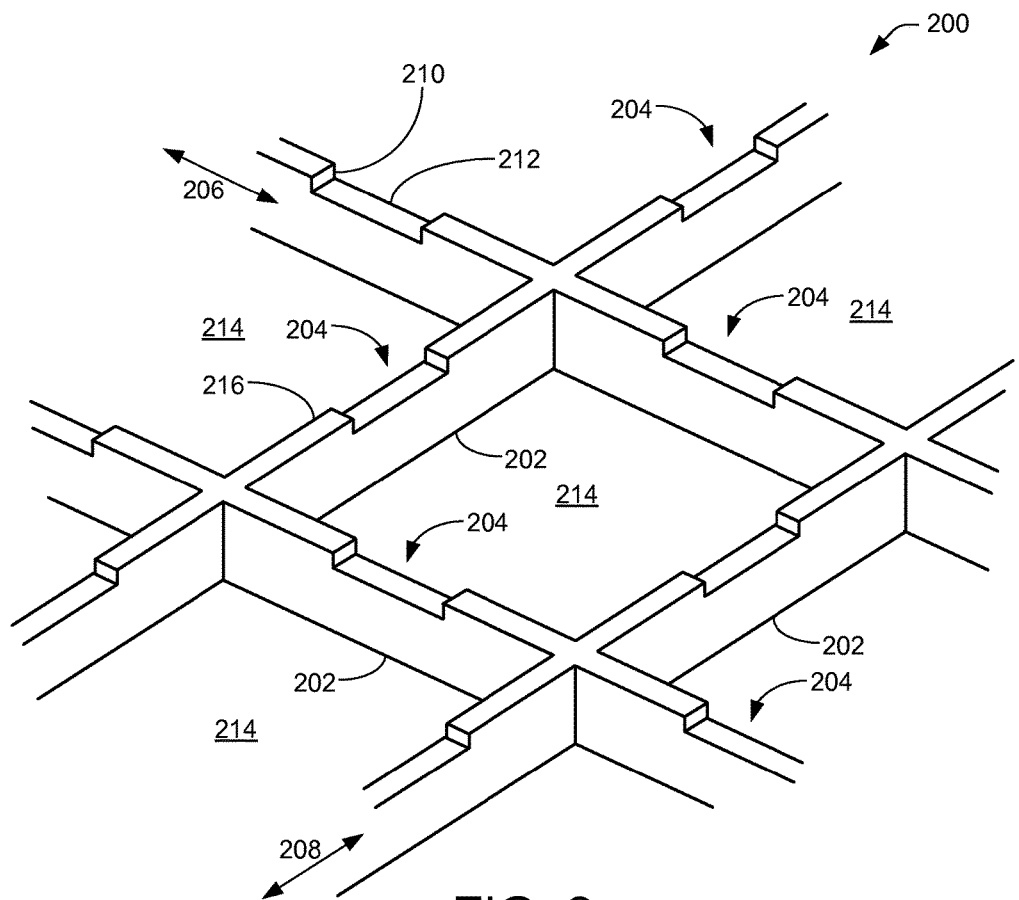
FIG. 2 is a perspective view of a portion of a spacer grid, according to various embodiments.

FIG. 2 is a perspective view of a portion of a spacer grid 200 that may be incorporated in an electrowetting display, according to various embodiments. Though not illustrated, a bottom surface 202 of spacer grid 200 may be joined to tops of pixel walls. Though figures herein illustrate pixel regions that are rectangular or square, pixel regions need not have such shapes. For example pixel regions may be round, oval, or have five or more sides, and claimed subject matter is not limited in this respect.

Spacer grid 200 includes liquid ducts 204 that may be distributed along tops of rows 206 and/or columns 208 of spacer grid 200. As will be discussed below, liquid ducts may have any of a number of shapes, such as a rectangular shape illustrated in FIG. 2. In this case, liquid ducts 204 include a sidewall 210 and a bottom portion 212. Apertures 214, which may coincide with pixel regions, are situated among the rows and columns of spacer grid 200. In some implementations, spacer grid 200 may comprise a material that is hydrophilic to an electrolyte solution. In other words, spacer grid 200 may have an affinity for the electrolyte solution but not for oil. In some implementations, material for spacer grid 200 may include one or more different types of materials. For example, spacer grid 200 may comprise a multilayer construction that includes one or more different types of materials, which may include one or more different types of photoresist materials.

Though not illustrated in FIG. 2, in some implementations, top surfaces 216 may be joined to a second support plate of an electrowetting display by an adhesive, for example. In other implementations, top surfaces 216 may be formed (e.g., fabricated) on a second support plate.

Figure 3:
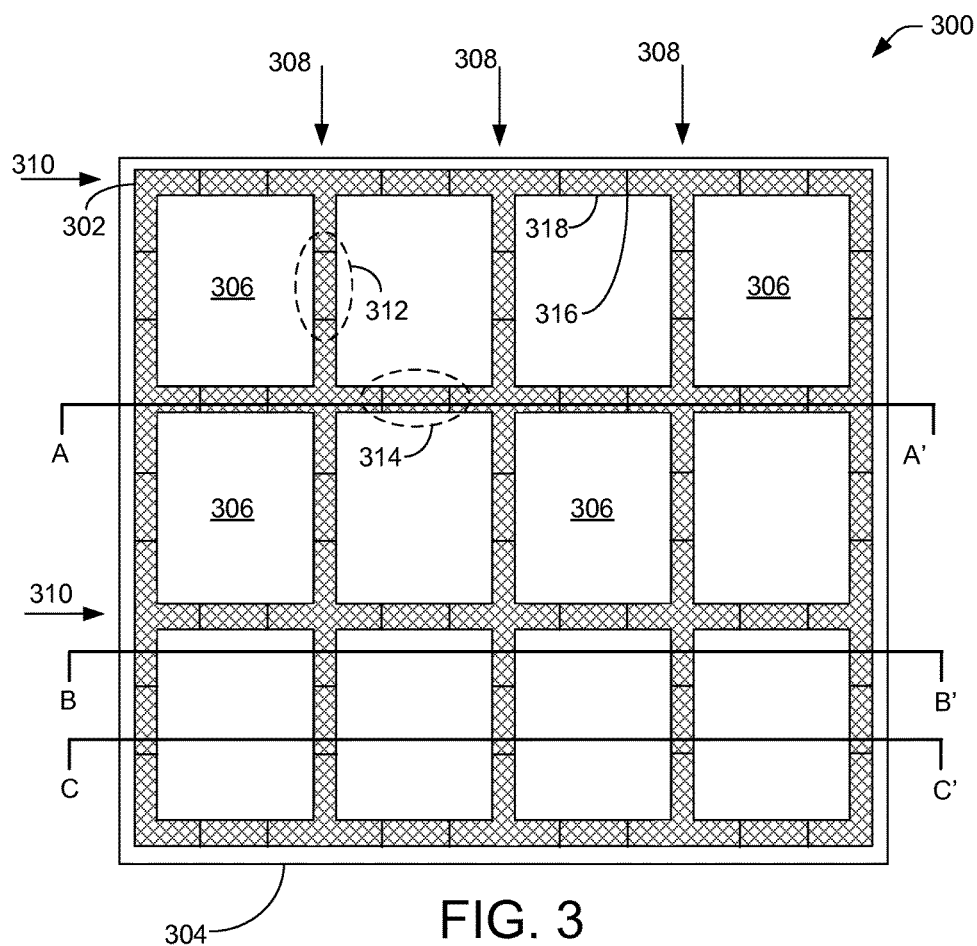
FIG. 3 is a top view of a portion of an electrowetting display device, illustrating a spacer grid, according to various embodiments.

FIG. 3 is a top view of a portion 300 of an electrowetting display device, illustrating a spacer grid 302, according to various embodiments. Among other things, pixel walls (not illustrated in FIG. 3) and spacer grid 302 may be disposed on a first support plate portion 304. For sake of clarity, various layer and elements (e.g., electrode layers, a hydrophobic layer, and barrier layers) that may be disposed on first support plate portion 304 are not illustrated. Also for sake of clarity, spacer grids herein are illustrated as aligning with pixel walls so that portions of the spacer grid are disposed on pixel walls in every pixel region. This, however, need not be the case. For example, a grid structure of a spacer grid may be coarser (e.g., lower density of apertures per unit area) as compared to a grid of pixel walls on which the spacer grid is disposed. Claimed subject matter is not limited in this respect. The pixel walls may be disposed on a hydrophobic layer (not illustrated in FIG. 3) and partition pixel regions 306 from one another. Spacer grid 302 may be disposed on tops of the pixel walls. Though not illustrated, pixel regions may be filled over with an oil and an electrolyte solution may be disposed over at least portions of the hydrophobic layer, the pixel walls, the oil, and may surround spacer grid 302. A second support plate, such as second support plate 118 illustrated in FIG. 1, may cover portion 300 and enclose the electrolyte solution and the oil, for example.

Spacer grid 302 may include a plurality of liquid ducts along columns 308 and rows 310 of spacer grid 302. In particular, for example, liquid ducts 312 may be positioned along columns 308 and liquid ducts 314 may be positioned along rows 310. Liquid ducts situated in rows may be the same as or different from liquid ducts situated in columns. Liquid ducts situated in rows may be the same or different along the rows, and liquid ducts situated in columns may be the same or different along the columns. Also combinations of similar liquid ducts situated in rows with liquid ducts situated in columns having variable shapes and dimensions or combinations of similar liquid ducts situated in columns with liquid ducts in rows having variable shapes and dimensions are possible. The location of the liquid ducts can also differ within rows and columns. Liquid ducts may include a sidewall 316 and a bottom surface 318, either of which may be orthogonal to one another or angled, based, at least in part, on the shape of the liquid ducts.

In some embodiments, a liquid duct may be included in each section of spacer grid 302 that surrounds each pixel region 306, as shown in FIG. 3. In other embodiments, a liquid duct may be included in alternate (or other combination or pattern of) sections of spacer grid 302 that surrounds each pixel region 306. In still other embodiments, more than one liquid duct may be included in each section of spacer grid 302 that surrounds each pixel region 306.

A section line A-A' is drawn through a row 310 of spacer grid 302. A section line B-B' is drawn through portions of spacer grid 302 and apertures 306. A section line C-C' is drawn through apertures 306 and portions of spacer grid 302 that include liquid ducts. These section lines are described below.

Figure 4:
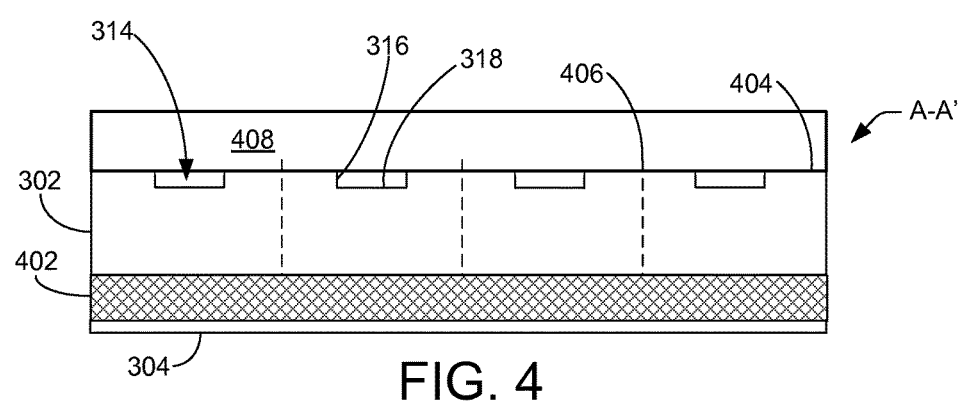
FIGS. 4-6 are cross-sectional views of a portion of a spacer grid, according to various embodiments.

FIG. 4 includes a cross-sectional view of a portion of spacer grid 302 along section line A-A', according to various embodiments. Spacer grid 302 is disposed on pixel wall 402, which is disposed on first support plate portion 304. Though spacer grid 302 may be joined (e.g., via an adhesive) to pixel wall 402, in some embodiments, spacer grid 302 may be formed on and include a second support plate (not shown in FIG. 4). For example, a structure that includes spacer grid 302 and a second support plate may be joined to tops of pixel walls during a fabrication process that laminates or otherwise joins the spacer grid/second support plate structure with a first support plate structure that includes the pixel walls. Widths of portions of spacer grid 302 may be the same as or different from pixel wall 402, and claimed subject matter is not limited in this respect.

Spacer grid 302 may include liquid ducts 314 having side walls 316 and bottom surfaces 318. A top surface 404 may be in contact (e.g., disposed on) the second support plate. Dashed vertical lines 406 indicate locations of centers of columns of spacer grid 302 and pixel wall 402. A top support plate 408 is adjacent to spacer grid 302 and borders one side of the liquid ducts.

Figure 5:
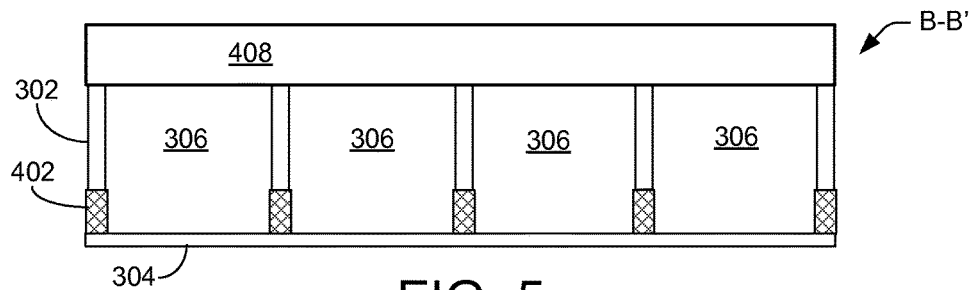

FIG. 5 includes a cross-sectional view of a portion of spacer grid 302 along section line B-B', according to various embodiments. Spacer grid 302 is disposed on pixel wall 402, which is disposed on first support plate portion 304. Liquid ducts are not included in section line B-B'. Accordingly, second support plate 408 is in contact with spacer grid in this illustration. Columns of spacer grid 302 and columns of pixel wall 402 partition pixel regions 306.

Figure 6:
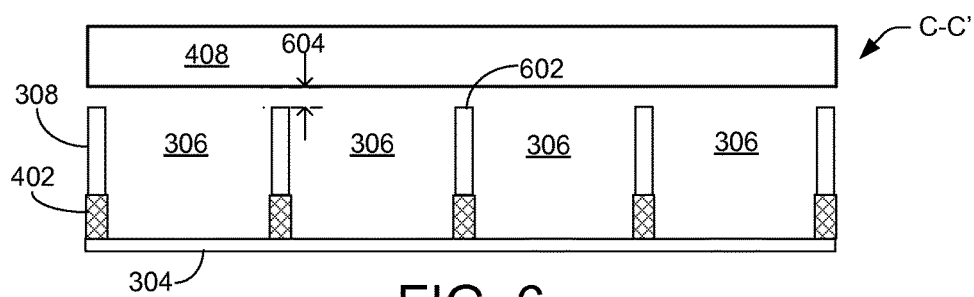

FIG. 6 is a cross-sectional view of a portion of spacer grid 302 along section line C-C', according to various embodiments. Spacer grid 302 is disposed on pixel wall 402, which is disposed on first support plate portion 304. Liquid ducts are disposed on top portions 602 of spacer grid 302 along section line C-C'. Top portions 602 coincide with bottom surfaces 318 (illustrated in FIG. 3) of liquid ducts 314. In the cross-section, presence of liquid ducts is apparent by the gap 604 on top portions 602. Gap 604 is between top portions 602 and second support plate 408.

Figure 7:
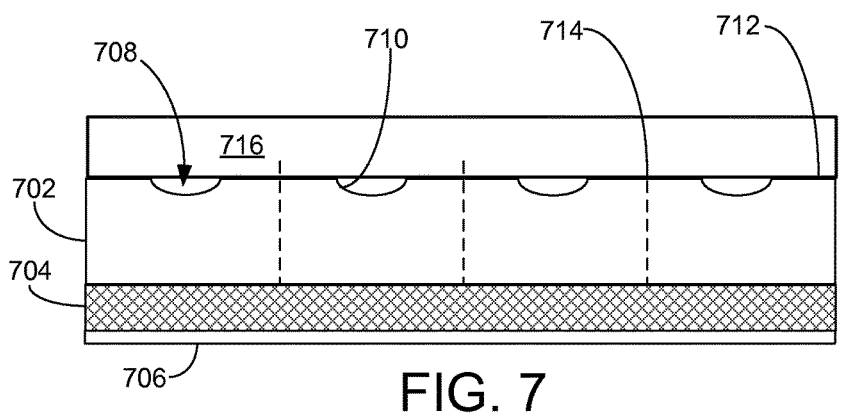
FIGS. 7-9 are cross-sectional views of a portion of a spacer grid, illustrating various shapes of liquid ducts, according to embodiments.
Figure 8:
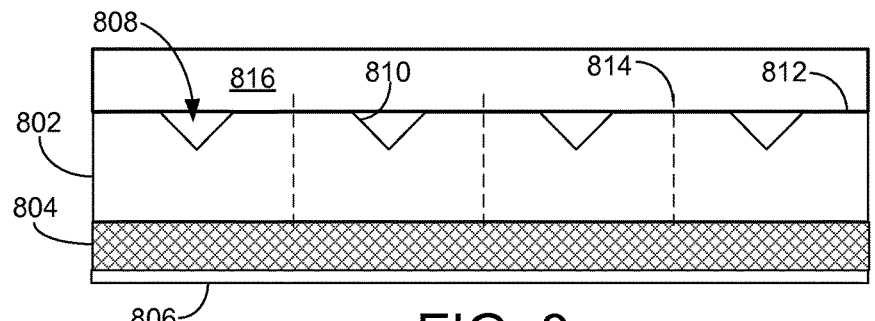
Figure 9:
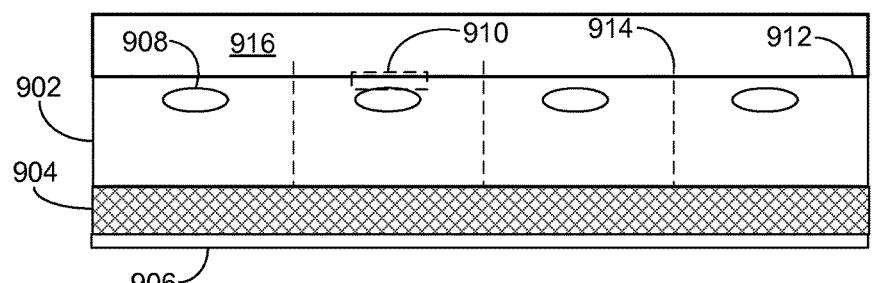

FIGS. 7-9 are cross-sectional views of a portion of a spacer grid, illustrating various shapes and sizes (e.g., width and height) of liquid ducts, according to embodiments. For example, such cross-sections may be along section line A-A' illustrated in FIG. 3. In some examples, depths of liquid ducts in a spacer grid may be about one-third the height of the spacer grid, though claimed subject matter is not limited in this respect. In some implementations, depths and other dimensions of liquid ducts may vary randomly or by location across the array of pixel regions on which the spacer grid is disposed.

In FIG. 7, a spacer grid 702 is disposed on a pixel wall 704, which is disposed on a first support plate portion 706. Spacer grid 702 may include liquid ducts 708 having sloped side walls 710. A top surface 712 may be in contact (e.g., disposed on) a second support plate. Dashed vertical lines 714 indicate locations of centers of intersecting columns of spacer grid 702 and pixel wall 704. Top support plate 716 borders one side of liquid ducts 708.

In FIG. 8, a spacer grid 802 is disposed on a pixel wall 804, which is disposed on a first support plate portion 806. Spacer grid 802 may include liquid ducts 808 having sloped side walls 810. A top surface 812 may be in contact (e.g., disposed on) a second support plate. Dashed vertical lines 814 indicate locations of centers of intersecting columns of spacer grid 802 and pixel wall 804. Top support plate 816 borders one side of liquid ducts 808.

In FIG. 9, a spacer grid 902 is disposed on a pixel wall 904, which is disposed on a first support plate portion 906. Spacer grid 902 may include liquid ducts 908 and portions 910 (indicated by dashed rectangle) of spacer grid 902 between the liquid ducts and a top surface 912. In other words, such liquid ducts are not in contact with top surface 912. A second support plate may be in contact with top surface 912. Dashed vertical lines 914 indicate locations of centers of intersecting columns of spacer grid 902 and pixel wall 904. Top support plate 916 borders adjacent surface 912.

Figure 10:
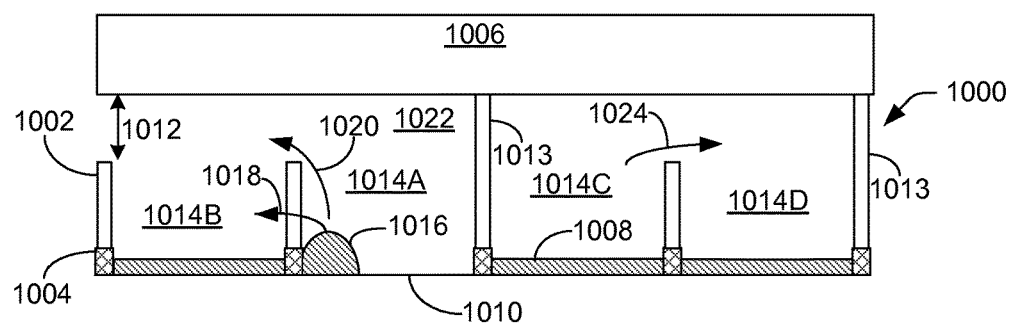
FIG. 10 is a cross-sectional view of a portion of an electrowetting display, according to various embodiments.

FIG. 10 is a cross-sectional view of a portion of an electrowetting display that includes a bottom structure 1000, a spacer grid 1002 disposed on pixel walls 1004, and a second support plate 1006, according to various embodiments. For sake of clarity, elements and layers on a first support plate below the bottom of oil 1008, and the first support plate itself, are not illustrated in FIG. 10. A surface 1010 may comprise a top of a hydrophobic layer, for example. Second support plate 1006 covers bottom structure 1000. In some embodiments, spacer grid 1002 may be formed on top plate 1006, while in other embodiments spacer grid 1002 may be formed on pixel walls 1004. Gaps 1012 indicate the presence of liquid ducts between second support plate 1006 and spacer grid 1002 in this particular cross-section. In the example embodiment, portions 1013 of spacer grid 1002 are illustrated as being in contact with second support plate 1006. Thus, for example, locations of liquid ducts may vary over different parts of spacer grid 1002.

Spacer grid 1002 incorporated in an electrowetting display contributes to the mechanical integrity of the electrowetting display. In particular, a spacer grid may provide a relatively large amount of surface area of a second support plate that is mechanically supported by the spacer grid. Also, spacer grid 1002 may add effective height to pixel walls 1004 and thus reduce likelihood of "spill-over", described in detail below.

Spacer grid 1002 joined to tops of pixel walls 1004 add to the height of the pixel walls disposed on the first support plate. The resulting extra wall height may help prevent oil from "spilling" over pixel walls from one pixel region to an adjacent pixel region. Such spilling may occur, for example, due to mechanical shock that tends to produce a surge or other such movement of oil 1008. Likelihood of spill-over by surging may be greater for an active pixel, such as active pixel region 1014A. Four pixel regions are illustrated in the figure, of which one pixel region 1014A is active and three pixels regions 1014B-1014D are inactive.

In active pixel region 1014A, a portion 1016 of oil may be displaced "tightly" against pixel walls 1004 and spacer grid 1002 toward an edge of the pixel region. Because forces inducing such displacement are primarily in a horizontal (e.g. parallel with the support plates) direction, the displaced oil tends to be squeezed in an upward direction along the pixel walls resulting in a relatively tall bead of oil portion 1016. This may be compared to oil 1008 in an inactive pixel region 1014B, for example. Top portions of such a tall bead of oil may spill over the pixel walls without a spacer grid, a scenario of which is indicated by arrow 1018. Spacer grid 1002 effectively increases the overall height of the pixel "walls" and thus may prevent such spillover. For example, arrow 1020 indicates the extra height (by the presence of spacer grid 1002) that oil would need to surpass to surge to an adjacent pixel region.

In some embodiments, an electrolyte solution 1022 covers oil 1008, spacer grid 1002, and pixel walls 1004. During a fabrication process, the first support plate including the pixel walls is laminated or otherwise coupled to top plate 1006 that includes the spacer grid by a rolling process, for example. During such a process, excess electrolyte solution 1022 may be squeezed out from between bottom portion 1000 and top plate 1006. Flow of excess electrolyte solution 1022 during fabrication is indicated by arrow 1024, which occurs through gaps (e.g., liquid ducts) 1012. For at least the reason that liquid ducts are situated relatively high above oil 1008, a tendency of flowing excess electrolyte solution to disturb oil 1008 may be reduced.

Figure 11:
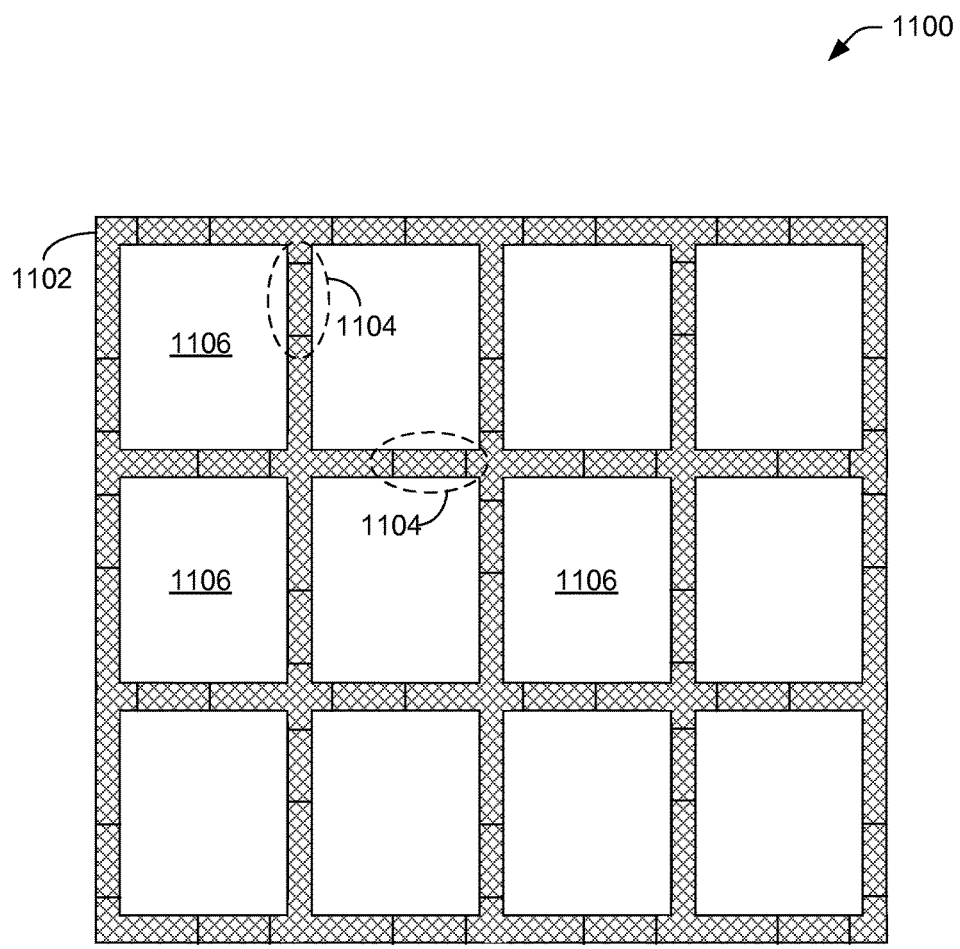
FIG. 11 is a top view of a portion of an electrowetting display device, illustrating a spacer grid, according to various embodiments.

FIG. 11 is a top view of a portion 1100 of an electrowetting display device, illustrating a spacer grid 1102, according to various embodiments. Portion 1100 is similar to portion 300, illustrated in FIG. 3, except that liquid ducts 1104 are not situated at centers of sides of pixel regions 1106 as they are for portion 300. Instead, liquid ducts 1104 may be situated toward corners of pixel regions 1106. In other words, liquid ducts 1104 need not be situated at any particular portion of spacer grid 1102. In some embodiments, a liquid duct may be included in each section of spacer grid 1102 that surrounds each pixel region 1106. In other embodiments, a liquid duct may be included in alternate (or other combination or pattern of) sections of spacer grid 1102 that surrounds each pixel region 1106. In still other embodiments, more than one liquid duct may be included in each section of spacer grid 1102 that surrounds each pixel region 1106.

Figure 12:
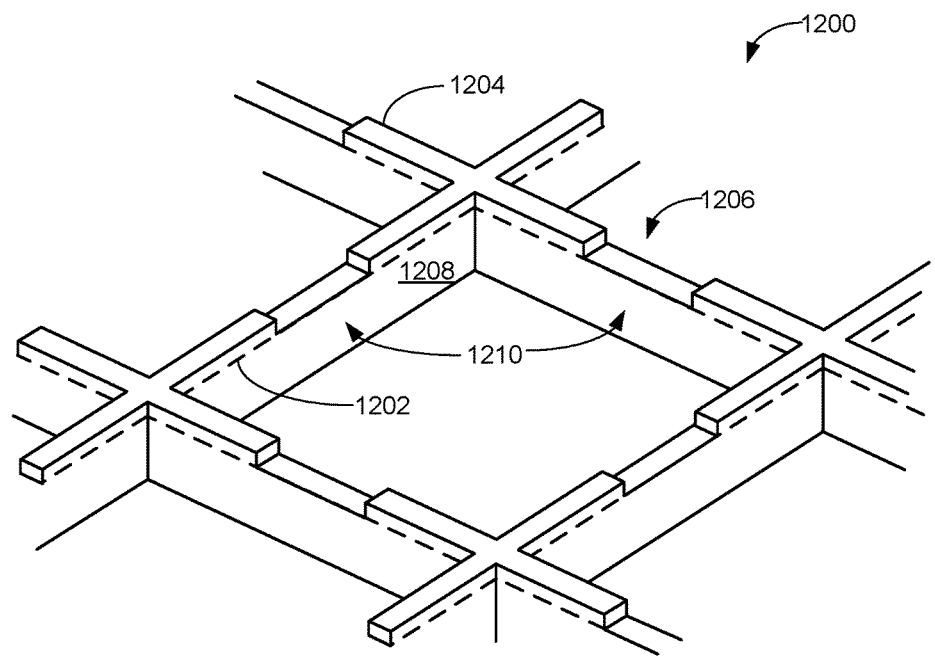
FIG. 12 is a perspective view of a portion of a spacer grid, according to various embodiments.

FIG. 12 is a perspective view of the portion of a spacer grid 1200, which may be similar to or the same as spacer grid 200, previously illustrated in FIG. 2, according to various embodiments. Dashed line 1202 indicates an interface between materials deposited during different process of fabrication. For example, in one embodiment, "X"-structures 1204 (above dashed line 1202) that separate liquid ducts 1206 may be formed in a process separate from forming grid portion 1208 (below dashed line 1202). Liquid ducts 1206 may be considered to be channels in "X"-structures 1204. Moreover, portions of grid portion 1208 include bridges 1210 that span across the channels (though such "bridges" are depicted in an "upside-down" fashion in FIG. 12). In some embodiments, spacer grid 1200 may include a first material (X-structures 1204) above dashed line 1202 and a second material (grid portion 1208) different from the first material below dashed line 1202.

FIGS. 13-16 illustrate portions of a process for fabricating a spacer grid, such as spacer grid 200, for example, which includes liquid ducts. FIGS. 13-16 are cross-sectional views that may be along, for example, a line section C-C', illustrated in FIG. 3.

Figure 13:
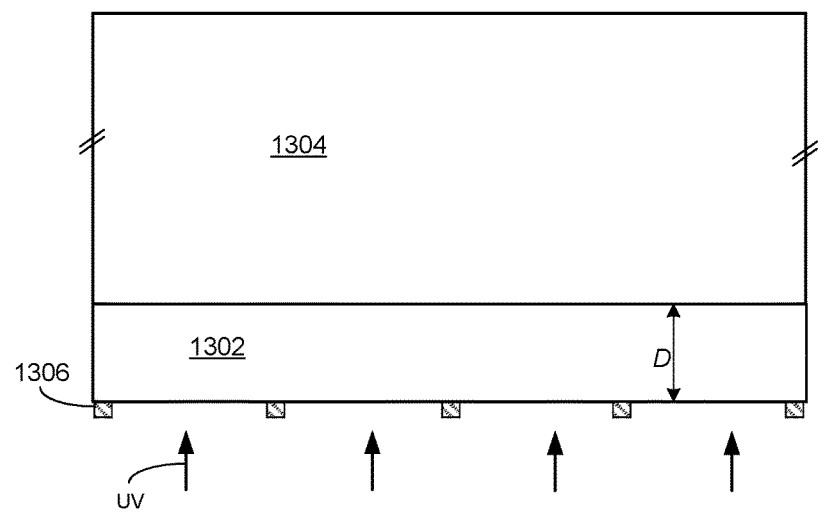
FIGS. 13-16 illustrate portions of a process for fabricating an electrowetting display, according to some embodiments.

In FIG. 13, a first spacer material 1302 may be deposited on a second support plate 1304, which may comprise glass, plastic, or other transparent material. Techniques for depositing first spacer material 1302 may include, for example, wet coating techniques like, for example, spin coating or slit coating. First spacer material 1302 may comprise, for example, a photoresist material, plastic, or an epoxy material, just to name a few examples. In some cases, a spacer material may comprise an epoxy-based negative photoresist SU-8. First spacer material 1302 may be deposited to a thickness of D, which may be the depth of the liquid ducts that will be formed from the first spacer material. An etch mask 1306 may be placed on or over a surface of first spacer material 1302. Such an etch mask may be used for photolithography processes, for example. In some implementations, an etch mask may be a separate part, for example, in an exposure machine and need not be physically added and/or attached to any layer or portion (e.g., sacrificial layer or photoresist layer) of the spacer grid. Regions of first spacer material 1302 not covered by etch mask 1306 may be exposed to electromagnetic (EM) radiation, which may change the physical properties of first spacer material 1302. For example, portions of first spacer material 1302 exposed to EM radiation may be etched or dissolved by a subsequent process, whereas portions of first spacer material 1302 not exposed to the EM radiation may be resistant to etching or dissolution by the subsequent process. In some implementations, etch mask 1306 may comprise a black photosensitive material having substantially zero light or EM transmission.

Figure 14:
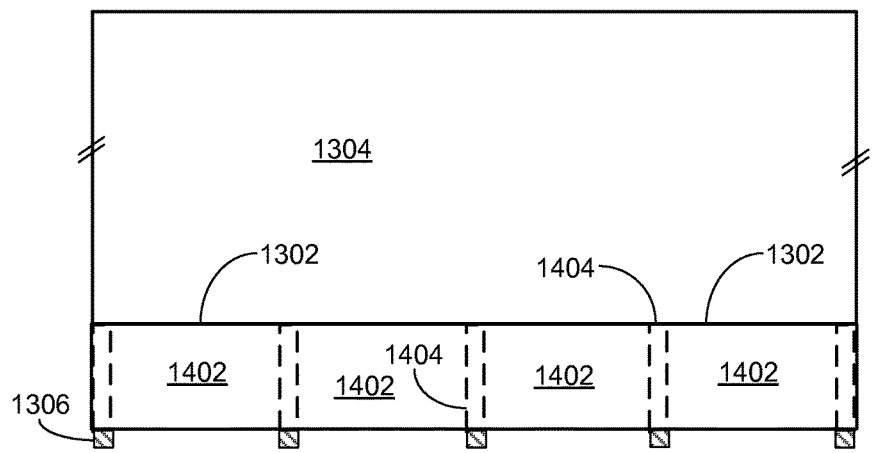

FIG. 14 illustrates portions 1402 of first spacer material 1302 exposed to EM radiation and portions 1404 of first spacer material 1302 not exposed to the EM radiation. Accordingly, as explained above, portions 1402 may be etched or dissolved by a particular process, whereas portions 1404 may be resistant to etching or dissolution by the particular process.

Figure 15:
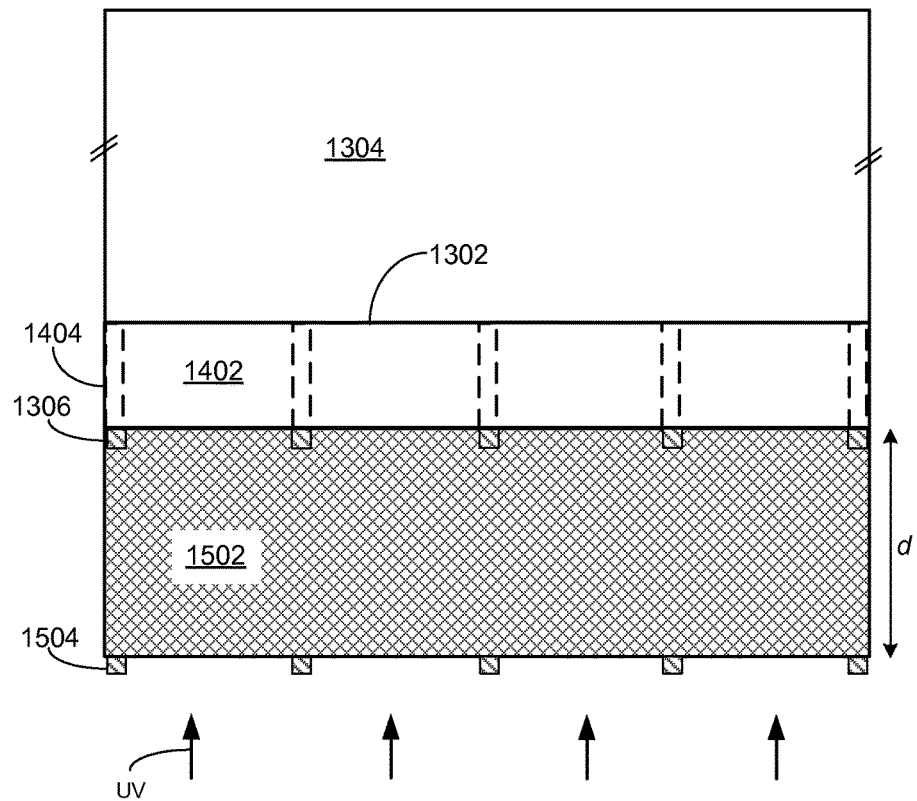

In FIG. 15, a second spacer material 1502 may be deposited on spacer material 1302 and etch mask 1306. Etching mask 1306 may be removed or may remain and be of use in subsequent processing steps. Such material may comprise, for example, a photoresist material, plastic, or an epoxy material, just to name a few examples. Techniques for depositing second spacer material 1502 may include, for example, spincoating, slitcoating, or lamination. In some implementations, a thickness of first spacer material 1302 is less than a thickness of second spacer material 1502. Second spacer material 1502 may be deposited to a thickness of d, which may be the height of a top portion of a spacer grid that will be formed from the second spacer material. An etch mask 1504 may be placed on a surface of second spacer material 1502. Such an etch mask may be used for photolithography processes, for example. Regions of second spacer material 1502 not covered by etch mask 1504 may be exposed to EM radiation, which may change the physical properties of second spacer material 1502. For example, portions of second spacer material 1502 exposed to EM radiation may be etched or dissolved by a particular process, whereas portions of second spacer material 1502 not exposed to the EM radiation may be resistant to etching or dissolution by the particular process (positive imaging).

Figure 16:
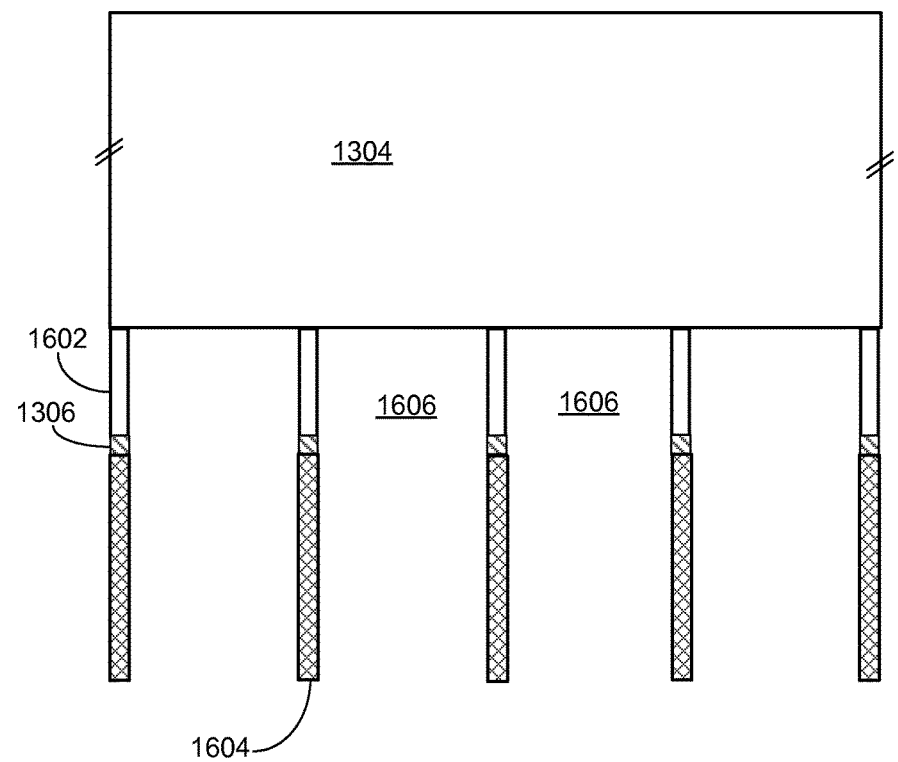

FIG. 16 illustrates a cross-sectional view of a portion of the structure in FIG. 15 subsequent to an etching process where both first spacer material 1302 and second spacer material 1502 are etched to the surface of second support plate 1304 between non-exposed first spacer material 1404. Such an etching process may be a single etching process that etches and removes both the first spacer material and the second spacer material. During the etching process, the exposed first spacer material 1302 is etched away, leaving non-exposed first spacer material 1302 to remain and form bottom spacer portions 1602. Top spacer portion 1604 may comprise walls of a spacer grid. Etch mask 1504 may be removed, though etch mask 1306 (which may comprise a black matrix) may remain. Liquid ducts may be included in bottom spacer portions 1602, wherein the etching process under-etches between top spacer portion 1604 and second support plate 1304. Top spacer portion 1604 includes self-supporting "bridges" spanning across channels that are liquid ducts. Such bridges are not visible in the cross-section view of FIG. 16. The perspective view of FIG. 12, however, illustrates such bridges (e.g., bridges 1210). Apertures 1606 coincide with pixel regions that are formed after the structure illustrated in FIG. 16 is joined with a first support plate having pixel walls disposed thereon.

Figure 17:
FIGS. 17-21 illustrate portions of a process for fabricating an electrowetting display, according to other embodiments.
Figure 18:
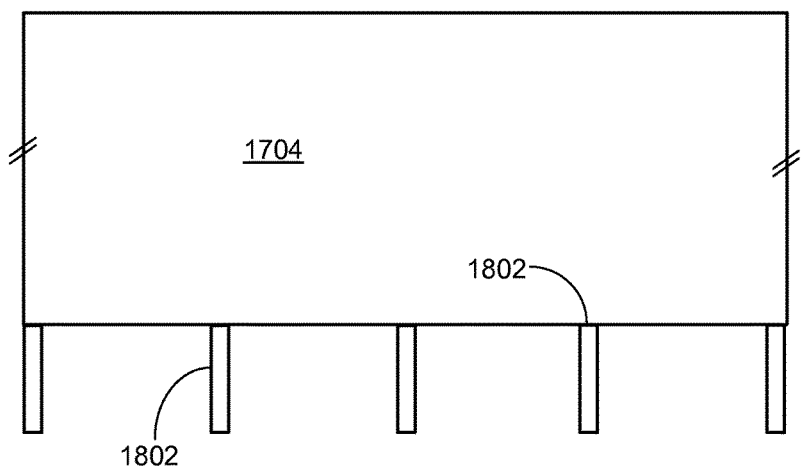

FIGS. 17-21 illustrate portions of a process for fabricating a spacer grid, such as spacer grid 200, for example, which includes liquid ducts. FIGS. 17-21 are cross-sectional views that may be along, for example, a line section C-C', illustrated in FIG. 3. In FIG. 17, a sacrificial layer 1702 may be deposited on a transparent support plate 1704. Sacrificial material may comprise any of a number of materials, such as a photoresist, for example. In some implementations, transparent support plate 1704 may include a substrate and an electrode layer, for example. Techniques for depositing sacrificial layer 1702 may include, for example, spin coating, slit coating, or lamination. Sacrificial layer 1702 may be deposited to a thickness of D, which may be the depth of liquid ducts that will be formed from the sacrificial layer. A first mask 1706 may be placed on sacrificial layer 1702. Portions of sacrificial layer 1702 not covered by first mask 1706 may be exposed to EM radiation In FIG. 18, exposed portions of sacrificial layer 1702 may subsequently be etched and removed so that the mask-covered portions of sacrificial layer 1702 remain on transparent support plate 1704. The remaining portions of sacrificial layer 1702 are called "liquid duct forms" because they will subsequently be used as temporary structural forms that displace a photoresist material to create cavities that are liquid ducts, as described below. For example, a liquid duct form prevents the photoresist material from occupying the space of the liquid duct form. A cavity in the photoresist material will be created by the subsequent removal of the liquid duct form. Accordingly, liquid duct forms 1802 are illustrated in FIG. 18. In some implementations, liquid duct forms may be made from a dissolvable material using a transfer grid material, for example. In such cases, an embossed material may be used.

Figure 19:
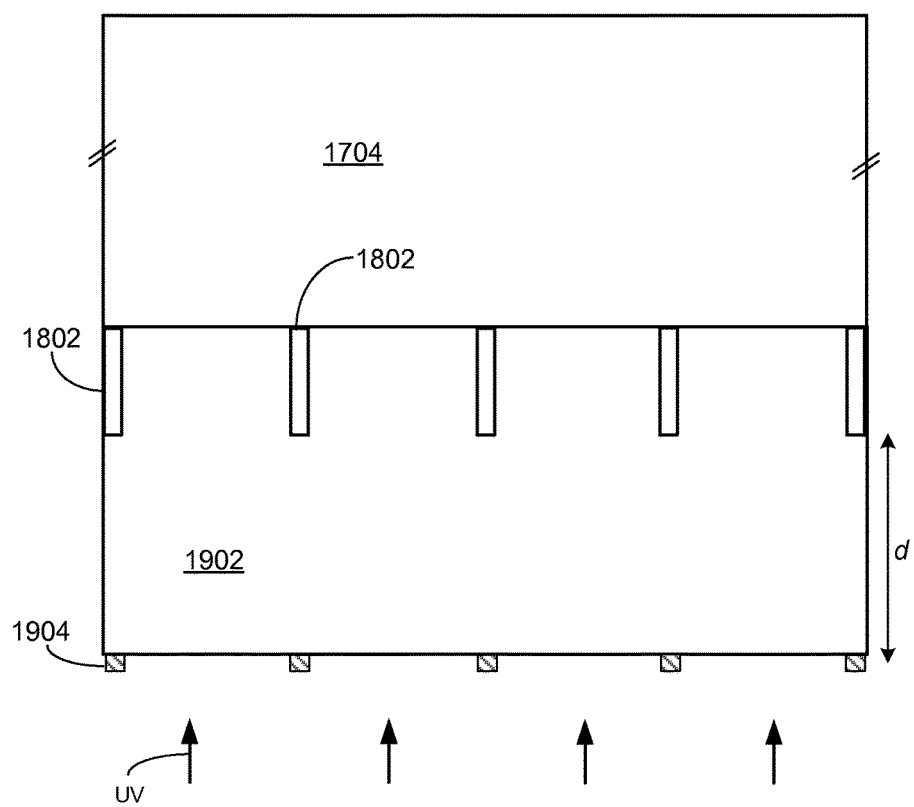

In FIG. 19, a photoresist layer 1902 may be deposited on liquid duct forms 1802 and transparent support plate 1704, though in some implementations layer 1902 need not be a photoresist material. Liquid duct forms 1802 extend outward from transparent support plate 1704 to a first distance. Photoresist layer 1902 may be deposited beyond the first distance to a thickness of d, indicated in FIG. 19, which may be the height of spacer walls bridging liquid ducts. A mask 1904 may be deposited on the photoresist layer. For example, mask 1904 may include rows and columns that form a grid. Portions of photoresist layer 1902 not covered by mask 1904 may be exposed to EM energy.

Figure 20:
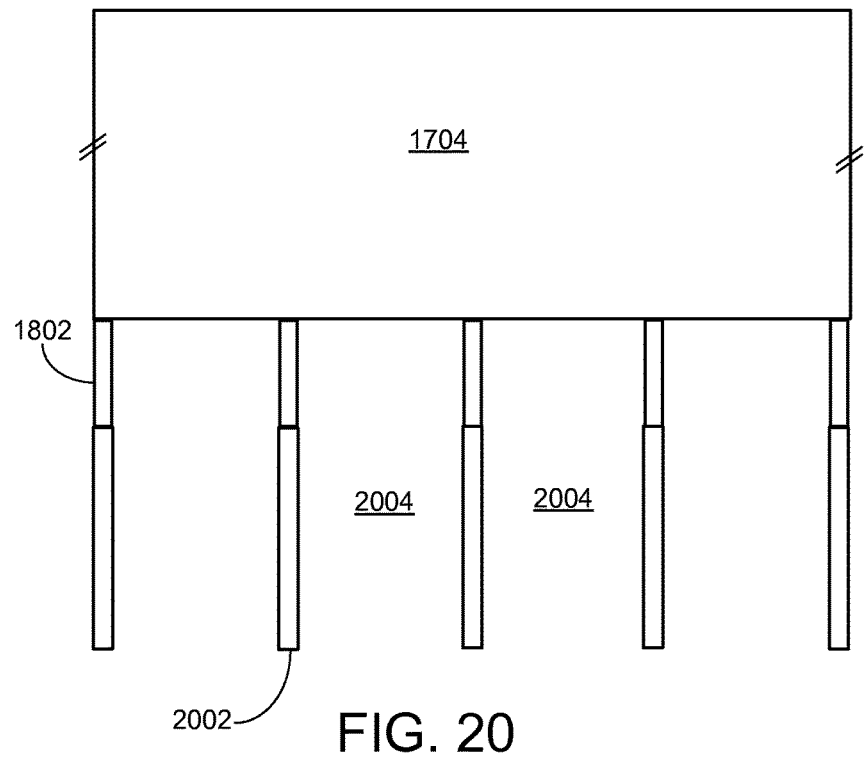
Figure 21:
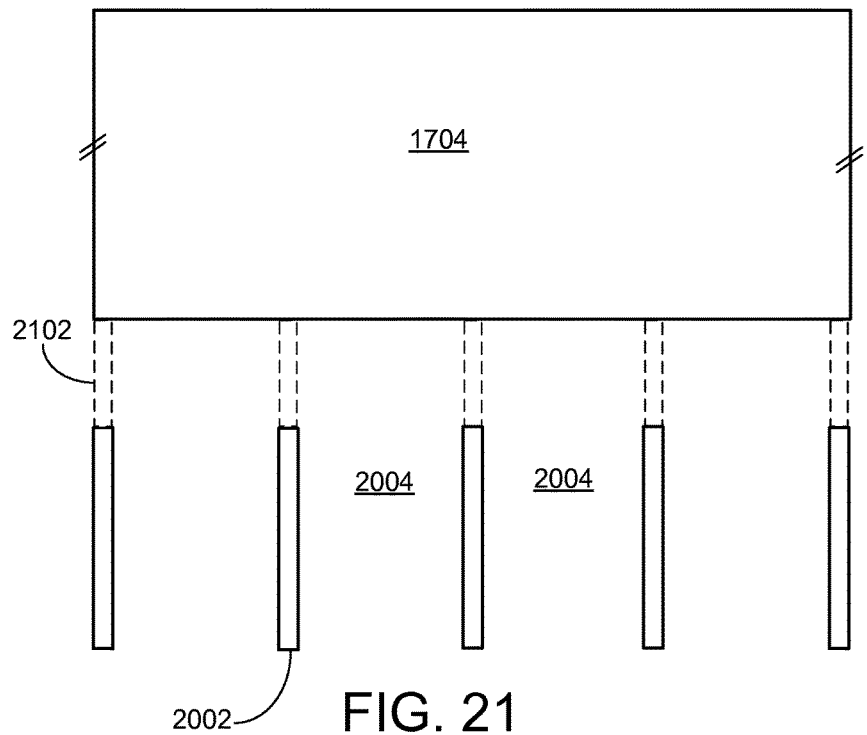

In FIG. 20, exposed portions of photoresist layer 1902 may subsequently be etched and removed so that the mask-covered portions of photoresist layer 1902 remain on liquid duct forms 1802 to form a spacer grid portion 2002. Mask 1904 may be removed. Next, an etch process removes liquid duct forms 1802, which may be made from a sacrificial material. For example the sacrificial material may be etched with an etch process that does not substantially affect spacer grid portion 2002. Such an etch process may remove material of liquid duct forms 1802 through apertures 2004. For example, spacer walls of grid portion 2002 may partition apertures 2004 from one another. A resulting structure is illustrated in FIG. 21. Dashed rectangles indicate liquid ducts 2102 disposed between transparent support plate 1704 and spacer grid portion 2002. Though not visible in FIG. 21, regions where etched photoresist layer 1902 is in contact with transparent support plate 1704 may have cross or "X" shapes for example, or any other shape.

In some embodiments, a process for etching or otherwise removing (e.g., by dissolving) liquid duct forms 1802 may be varied depending, at least in part, on location with respect to transparent support plate 1704. Such variation may allow for varying the size of liquid ducts formed by the etching or removing process. For example, duration of an etching process for liquid duct forms 1802 located in one portion of transparent support plate 1704 may be longer compared to duration of the etching process in another portion of transparent support plate 1704. In general, a longer etching process may result in larger liquid ducts by removing more material from liquid duct forms 1802.

Figure 22:
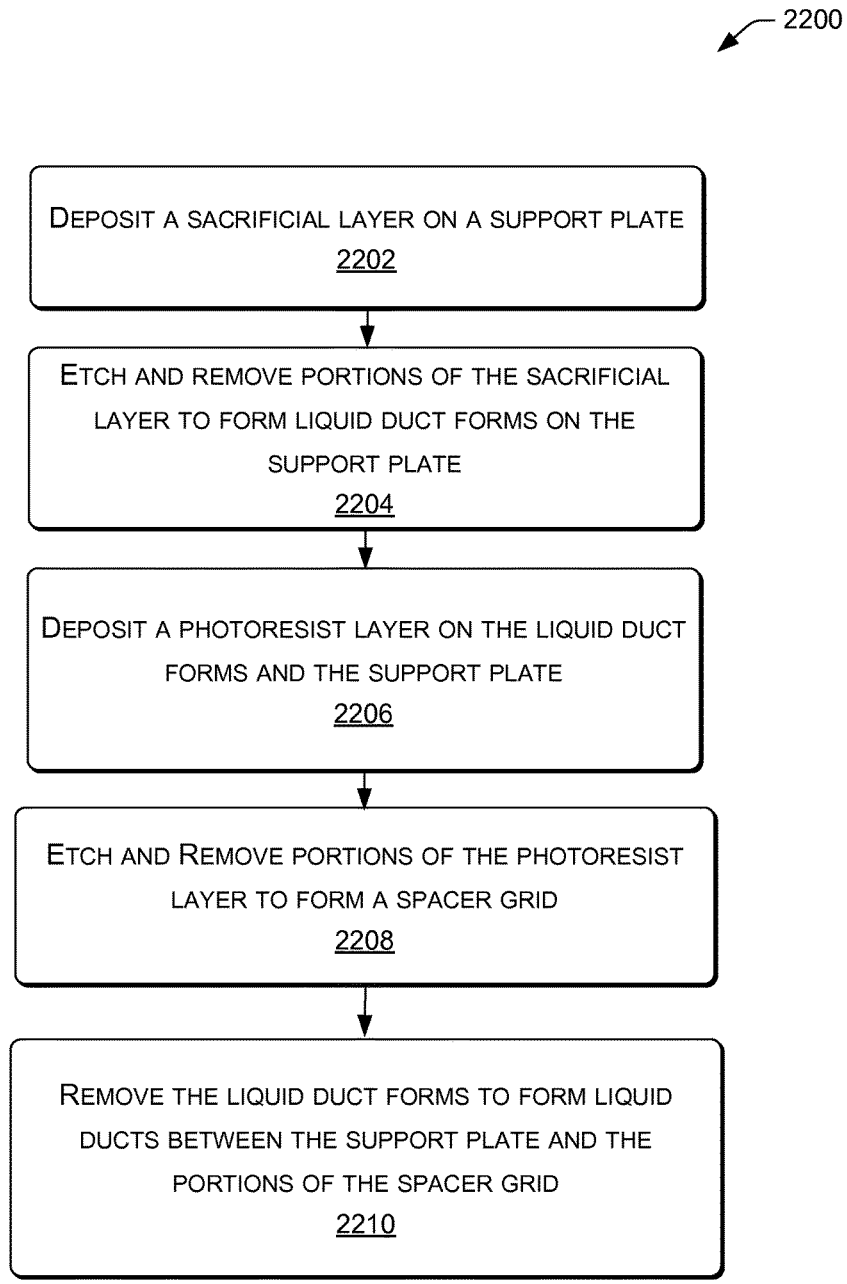
FIG. 22 is a flow diagram of a process for fabricating an electrowetting display, according to various example embodiments.

FIG. 22 is a flow diagram of a process 2200 for fabricating a spacer grid, according to various example embodiments. For example, process 2200 may be similar to or the same as fabrication processes depicted in FIGS. 17-21. At block 2202, a sacrificial layer may be deposited on a support plate, which may be transparent. In some implementations, the transparent support plate may include a substrate and an electrode layer, for example. Techniques for depositing the sacrificial layer may include, for example, spincoating, slitcoating, or lamination. The sacrificial layer may be deposited to a particular thickness that may be the depth of liquid ducts that will be formed from the sacrificial layer. A first mask may be placed on the sacrificial layer. Portions of the sacrificial layer not covered by the first mask may be exposed to EM energy.

At block 2204, portions of the sacrificial layer may subsequently be etched and removed so that the mask-covered portions of the sacrificial layer remain on the transparent support plate. The remaining portions of the sacrificial layer are liquid duct forms.

At block 2206, a photoresist layer may be deposited on the liquid duct forms and the transparent support plate. The photoresist layer may be deposited to a particular thickness, which may be the height of spacer walls bridging liquid ducts. A second mask may be placed on the photoresist layer. For example, the second mask may include rows and columns that form a grid. Portions of the photoresist layer not covered by the second mask may be exposed to EM radiation At block 2208, exposed portions of the photoresist layer may subsequently be etched and removed so that the mask-covered portions of the photoresist layer remain on the liquid duct forms to form a spacer grid portion. The second mask may be removed. At block 2210, an etching or dissolving process removes the liquid duct forms, which are made from a sacrificial material that may be removed with an etch process that does not substantially affect the spacer grid portion.

In one embodiment, returning to block 2206, the photoresist layer deposited on the liquid duct forms and the transparent support plate may be covered with a black etch mask. By not removing this black etch mask after fabrication of the spacer grid structure, this black etch mask may act as a black matrix. In other words, the second mask deposited on the photoresist layer may be a black matrix. For example, the black matrix may include rows and columns that form a grid. The black matrix may remain in the spacer grid structure, even after fabrication is completed. The black matrix may provide a number of benefits by being located relatively close to the bottom (e.g., the oil, electrode portion) of a pixel region. For example, the black matrix, providing an light absorbing screen, may improve optical performance by reducing optical crosstalk between and among the pixel regions.

Figure 23:
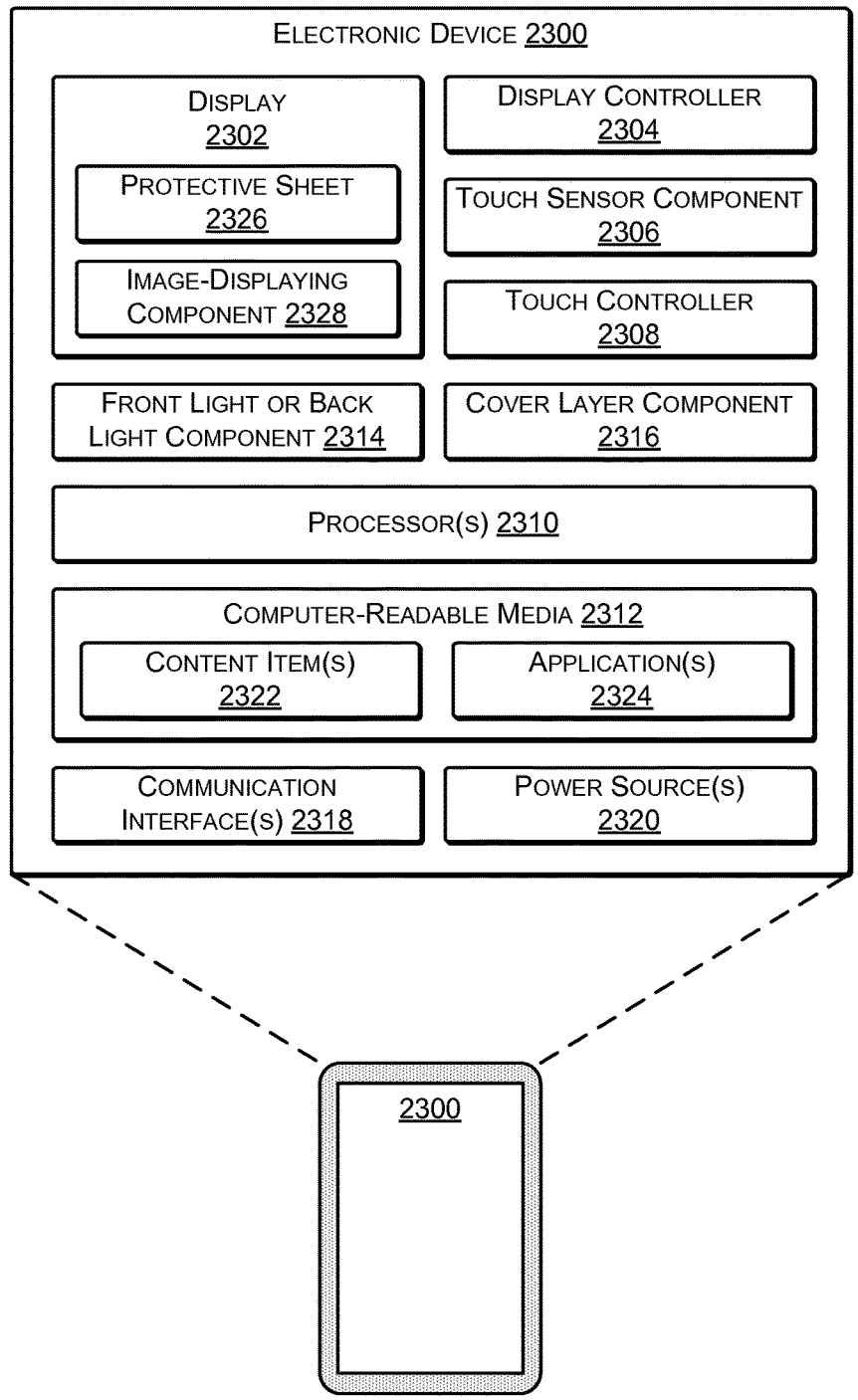
FIG. 23 illustrates an example electronic device that may incorporate a display device, according to some embodiments.

FIG. 23 illustrates an example electronic device 2300 that may incorporate any of the display devices discussed above. The device 2300 may comprise any type of electronic device having a display. For instance, the device 2300 may be a mobile electronic device (e.g., an electronic book reader, a tablet computing device, a laptop computer, a smart phone or other multifunction communication device, a portable digital assistant, a wearable computing device, an automotive display, etc.). Alternatively, the device 2300 may be a non-mobile electronic device (e.g., a computer display, a television, etc.). In addition, while FIG. 23 illustrates several example components of the electronic device 2300, it is to be appreciated that the device 2300 may also include other conventional components, such as an operating system, system busses, input/output components, and the like. Further, in other examples, such as in the case of a television or computer monitor, the electronic device 2300 may only include a subset of the components illustrated.

Regardless of the specific implementation of the electronic device 2300, the device 2300 includes a display 2302 and a corresponding display controller 2304. The display 2302 may represent a reflective or transmissive display.

In an implementation, the display comprises an electrowetting display that employs an applied voltage to change the surface tension of a fluid in relation to a surface. For example, such an electrowetting display may include the array of pixels 100 illustrated in FIG. 1, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by contracting a colored oil film if a voltage is applied to individual pixels of the display. If the voltage is absent, the colored oil forms a continuous film within a pixel, and the color may thus be visible to a user of the display. On the other hand, if the voltage is applied to the pixel, the colored oil is displaced and the pixel becomes transparent. If multiple pixels of the display are independently activated, the display may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, the display 2302 may represent a backlit display, examples of which are mentioned above.

In addition to including the display 2302, FIG. 23 illustrates that some examples of the device 2300 may include a touch sensor component 2306 and a touch controller 2308. In some instances, at least one touch sensor component 2306 resides with, or is stacked on, the display 2302 to form a touch-sensitive display. Thus, the display 2302 may be capable of both accepting user touch input and rendering content in response to or corresponding to the touch input. As several examples, the touch sensor component 2306 may comprise a capacitive touch sensor, a force sensitive resistance (FSR), an interpolating force sensitive resistance (IFSR) sensor, or any other type of touch sensor. In some instances, the touch sensor component 2306 is capable of detecting touches as well as determining an amount of pressure or force of these touches.

FIG. 23 further illustrates that the electronic device 2300 may include one or more processors 2310 and one or more computer-readable media 2312, as well as a front light component 2314 (which may alternatively be a backlight component in the case of a backlit display) for lighting the display 2302, a cover layer component 2316, such as a cover glass or cover sheet, one or more communication interfaces 2318 and one or more power sources 2320. The communication interfaces 2318 may support both wired and wireless connection to various networks, such as cellular networks, radio, WiFi networks, short range networks (e.g., Bluetooth®), infrared (IR), and so forth.

Depending on the configuration of the electronic device 2300, the computer-readable media 2312 (and other computer-readable media described throughout) is an example of computer storage media and may include volatile and nonvolatile memory. Thus, the computer-readable media 2312 may include, but is not limited to, RAM, ROM, EEPROM, flash memory, or other memory technology, or any other medium that may be used to store computer-readable instructions, programs, applications, media items, and/or data which may be accessed by the electronic device 2300.

The computer-readable media 2312 may be used to store any number of functional components that are executable on the processor 2310, as well as content items 2322 and applications 2324. Thus, the computer-readable media 2312 may include an operating system and a storage database to store one or more content items 2322, such as eBooks, audio books, songs, videos, still images, and the like. The computer-readable media 2312 of the electronic device 2300 may also store one or more content presentation applications to render content items on the device 2300. These content presentation applications may be implemented as various applications 2324 depending upon the content items 2322. For instance, the content presentation application may be an electronic book reader application for rending textual electronic books, an audio player for playing audio books or songs, a video player for playing video, and so forth.

In some instances, the electronic device 2300 may couple to a cover (not illustrated in FIG. 23) to protect the display (and other components in the display stack or display assembly) of the device 2300. In one example, the cover may include a back flap that covers a back portion of the device 2300 and a front flap that covers the display 2302 and the other components in the stack. The device 2300 and/or the cover may include a sensor (e.g., a Hall Effect sensor) to detect if the cover is open (i.e., if the front flap is not atop the display and other components). The sensor may send a signal to the front light component 2314 if the cover is open and, in response, the front light component 2314 may illuminate the display 2302. If the cover is closed, meanwhile, the front light component 2314 may receive a signal indicating that the cover has closed and, in response, the front light component 2314 may turn off.

Furthermore, the amount of light emitted by the front light component 2314 may vary. For instance, upon a user opening the cover, the light from the front light may gradually increase to its full illumination. In some instances, the device 2300 includes an ambient light sensor (not illustrated in FIG. 23) and the amount of illumination of the front light component 2314 may be based at least in part on the amount of ambient light detected by the ambient light sensor. For example, the front light component 2314 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of the display 2302 may vary depending on whether the front light component 2314 is on or off, or based on the amount of light provided by the front light component 2314. For instance, the electronic device 2300 may implement a larger default font or a greater contrast if the light is off compared to if the light is on. In some instances, the electronic device 2300 maintains, if the light is on, a contrast ratio for the display that is within a certain defined percentage of the contrast ratio if the light is off.

As described above, the touch sensor component 2306 may comprise a capacitive touch sensor that resides atop the display 2302. In some examples, the touch sensor component 2306 may be formed on or integrated with the cover layer component 2316. In other examples, the touch sensor component 2306 may be a separate component in the stack of the display assembly. The front light component 2314 may reside atop or below the touch sensor component 2306. In some instances, either the touch sensor component 2306 or the front light component 2314 is coupled to a top surface of a protective sheet 2326 of the display 2302. As one example, the front light component 2314 may include a lightguide sheet and a light source (not illustrated in FIG.

23). The lightguide sheet may comprise a substrate (e.g., a transparent thermoplastic such as PMMA or other acrylic), a layer of lacquer and multiple grating elements formed in the layer of lacquer that function to propagate light from the light source towards the display 2302, thus illuminating the display 2302.

The cover layer component 2316 may include a transparent substrate or sheet having an outer layer that functions to reduce at least one of glare or reflection of ambient light incident on the electronic device 2300. In some instances, the cover layer component 2316 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3 h pencil). Without such scratch resistance, a device may be more easily scratched and a user may perceive the scratches from the light that is dispersed over the top of the reflective display. In some examples, the protective sheet 2326 may include a similar UV-cured hard coating on the outer surface. The cover layer component 2316 may couple to another component or to the protective sheet 2326 of the display 2302. The cover layer component 2316 may, in some instances, also include a UV filter, a UV-absorbing dye, or the like, for protecting components lower in the stack from UV light incident on the electronic device 2300. In still other examples, the cover layer component 2316 may include a sheet of high-strength glass having an antiglare and/or antireflective coating.

The display 2302 includes the protective sheet 2326 overlying an image-displaying component 2328. For example, the display 2302 may be preassembled to have the protective sheet 2326 as an outer surface on the upper or image-viewing side of the display 2302. Accordingly, the protective sheet 2326 may be integral with and may overlie the image-displaying component 2328. The protective sheet 2326 may be optically transparent to enable a user to view, through the protective sheet 2326, an image presented on the image-displaying component 2328 of the display 2302.

In some examples, the protective sheet 2326 may be a transparent polymer film in the range of 25 to 200 micrometers in thickness. As several examples, the protective sheet may be a transparent polyester, such as polyethylene terephthalate (PET) or polyethylene naphthalate (PEN), or other suitable transparent polymer film or sheet, such as a polycarbonate or an acrylic. In some examples, the outer surface of the protective sheet 2326 may include a coating, such as the hard coating described above. For instance, the hard coating may be applied to the outer surface of the protective sheet 2326 before or after assembly of the protective sheet 2326 with the image-displaying component 2328 of the display 2302. In some examples, the hard coating may include a photoinitiator or other reactive species in its composition, such as for curing the hard coating on the protective sheet 2326. Furthermore, in some examples, the protective sheet 2326 may be dyed with a UV-light-absorbing dye, or may be treated with other UV-absorbing treatment. For example, the protective sheet may be treated to have a specified UV cutoff such that UV light below a cutoff or threshold wavelength is at least partially absorbed by the protective sheet 2326, thereby protecting the image-displaying component 2328 from UV light.

According to some implementations herein, one or more of the components discussed above may be coupled to the display 2302 using fluid optically-clear adhesive (LOCA). For example, suppose that the light guide portion of the front light component 2314 is to be coupled to the display 2302. The light guide may be coupled to the display 2302 by placing the LOCA on the outer or upper surface of the protective sheet 2326. If the LOCA reaches the corner(s) and/or at least a portion of the perimeter of protective sheet, UV-curing may be performed on the LOCA at the corners and/or the portion of the perimeter. Thereafter, the remaining LOCA may be UV-cured and the front light component 2314 may be coupled to the LOCA. By first curing the corner(s) and/or perimeter, the techniques effectively create a barrier for the remaining LOCA and also prevent the formation of air gaps in the LOCA layer, thereby increasing the efficacy of the front light component 2314. In other implementations, the LOCA may be placed near a center of the protective sheet 2326, and pressed outwards towards a perimeter of the top surface of the protective sheet 2326 by placing the front light component 2314 on top of the LOCA. The LOCA may then be cured by directing UV light through the front light component 2314. As discussed above, and as discussed additionally below, various techniques, such as surface treatment of the protective sheet, may be used to prevent discoloration of the LOCA and/or the protective sheet 2326.

While FIG. 23 illustrates a few example components, the electronic device 2300 may have additional features or functionality. For example, the device 2300 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within the device 2300 may reside remotely from the device 2300 in some implementations. In these implementations, the device 2300 may utilize the communication interfaces 2318 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. A method for fabricating an electrowetting display, the method comprising:
   depositing a sacrificial photoresist layer on a support plate, wherein the support plate includes a substrate and an electrode layer, and wherein depositing the sacrificial photoresist layer at least partially covers the substrate and the electrode layer;
   placing a first mask on or over the sacrificial photoresist layer, wherein the first mask covers first portions of the sacrificial photoresist layer;
   exposing second portions of the sacrificial photoresist layer to electromagnetic energy;
   etching the second portions of the sacrificial photoresist layer so that the first portions of the sacrificial photoresist layer remain on the support plate;
   depositing a photoresist layer on the first portions of the sacrificial photoresist layer and the support plate;
   placing a second mask on or over the photoresist layer, wherein the second mask covers first portions of the photoresist layer;
   exposing second portions of the photoresist layer to electromagnetic energy;
   etching the second portions of the photoresist layer so that the first portions of the photoresist layer remain; and
   removing the first portions of the sacrificial photoresist layer to form liquid ducts between the support plate and the first portions of the photoresist layer.

2. The method of claim 1, wherein removing the first portions of the sacrificial photoresist layer comprises:
   etching the first portions of the sacrificial photoresist layer between the support plate and the first portions of the photoresist layer.

3. The method of claim 1, wherein the first portions of the photoresist layer comprise rows and columns of spacer walls, wherein the spacer walls partition a plurality of pixel regions, and wherein removing the first portions of the sacrificial photoresist layer to form liquid ducts comprises:
   removing material of the first portions of the sacrificial photoresist layer through the pixel regions.

4. A method for fabricating an electrowetting display, the method comprising:
   depositing a sacrificial layer on a support plate;
   etching portions of the sacrificial layer to form liquid duct forms on the support plate;
   depositing a photoresist layer on the liquid duct forms and the support plate;
   etching portions of the photoresist layer to form a spacer grid; and
   removing the liquid duct forms to create cavities in the photoresist layer, wherein the cavities comprise liquid ducts between the support plate and portions of the spacer grid.

5. The method of claim 4, wherein removing the liquid duct forms comprises:
   removing, through openings in the spacer grid, sacrificial layer material that forms the liquid ducts.

6. The method of claim 5, wherein the openings comprise rectangular pixel regions surrounded by four walls of the spacer grid, and wherein at least one of the four walls includes one or more of the liquid ducts.

7. The method of claim 4, wherein the spacer grid contacts the support plate in crossed-shaped regions between the liquid ducts.

8. The method of claim 4, wherein the sacrificial layer comprises a photoresist material.

9. The method of claim 4, wherein one or more of a width or a height of each of the liquid ducts varies across the area of the support plate.

10. The method of claim 4, wherein the liquid ducts are rectangular.

11. The method of claim 4, wherein each of the liquid ducts may have one of a rectangular shape, a triangular shape, or a curved shape, and wherein the shape of each of the liquid ducts varies across the area of the support plate.

12. The method of claim 4, and further comprising:
   joining the spacer grid onto pixel walls disposed on a first support plate.

13. The method of claim 4, wherein removing the liquid duct forms further comprises:
   dissolving the liquid duct forms between the support plate and the portions of the spacer grid.

14. An electrowetting display comprising:
   a first support plate and a second support plate opposite the first support plate;
   a first spacer layer disposed on the second support plate, wherein the first spacer layer includes channels;
   a second spacer layer disposed on the first spacer layer, wherein the second spacer layer includes bridges that span across the channels of the first spacer layer; and
   pixel walls disposed on the first support plate, wherein the second spacer layer is disposed on the pixel walls.

15. The electrowetting display of claim 14, wherein the first spacer layer and the second spacer layer comprise materials different from one another.

16. The electrowetting display of claim 14, wherein the first spacer layer and the second spacer layer comprise a photoresist material.

17. The electrowetting display of claim 14, wherein one or more of widths, lengths, or shapes of each of the channels vary across the area of the second support plate.

18. The electrowetting display of claim 14, wherein the first spacer layer includes portions between the channels, wherein the portions are X-structures.

19. The electrowetting display of claim 14, wherein each of the channels extends between the second support plate and the second spacer layer, and wherein each of the bridges separates one of the channels from one of the pixel walls.

* * * * *